US010373677B2

(12) United States Patent
Usami et al.

(10) Patent No.: US 10,373,677 B2
(45) Date of Patent: Aug. 6, 2019

(54) SEMICONDUCTOR DEVICE TO REDUCE ENERGY CONSUMED TO WRITE DATA

(71) Applicant: SONY CORPORATION, Tokyo (JP)

(72) Inventors: Kimiyoshi Usami, Tokyo (JP); Masaru Kudo, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 15/737,374

(22) PCT Filed: Jun. 9, 2016

(86) PCT No.: PCT/JP2016/067196
§ 371 (c)(1),
(2) Date: Dec. 18, 2017

(87) PCT Pub. No.: WO2016/208407
PCT Pub. Date: Dec. 29, 2016

(65) Prior Publication Data
US 2018/0197600 A1    Jul. 12, 2018

(30) Foreign Application Priority Data

Jun. 24, 2015 (JP) .................................. 2015-126834

(51) Int. Cl.
*G11C 16/00* (2006.01)
*G11C 11/419* (2006.01)
(Continued)

(52) U.S. Cl.
CPC ............. *G11C 11/419* (2013.01); *G11C 5/14* (2013.01); *G11C 5/143* (2013.01); *G11C 11/15* (2013.01);
(Continued)

(58) Field of Classification Search
CPC .................................................... G11C 14/009
(Continued)

(56) References Cited

U.S. PATENT DOCUMENTS

2005/0226033 A1    10/2005 Moriyama
2011/0273925 A1*   11/2011 Yamamoto ......... G11C 14/0081
                                                 365/154
(Continued)

FOREIGN PATENT DOCUMENTS

JP    2004-063004    2/2004
JP    2014-225251    12/2014
(Continued)

OTHER PUBLICATIONS

International Search Report prepared by the Japan Patent Office dated Aug. 15, 2016, for International Application No. PCT/JP2016/067196.

*Primary Examiner* — Hoai V Ho
(74) *Attorney, Agent, or Firm* — Sheridan Ross P.C.

(57) ABSTRACT

This invention relates to a semiconductor device that reduces energy consumed to write data to a nonvolatile storing section. A write control circuit 34 stores the same data as that held in MTJ elements MTJ1 and MTJ2. In a store operation storing the data held in a slave latch 32 into the MTJ elements MTJ1 and MTJ2, the write control circuit 34 compares the data stored therein with the data held in the slave latch 32 to control whether or not to write the data to the MTJ elements MTJ1 and MTJ2. If the internally stored data coincides with the data held in the slave latch 32, the write control circuit 34 performs control not to write the data to the MTJ elements MTJ1 and MTJ2.

5 Claims, 11 Drawing Sheets

(51) Int. Cl.
  *G11C 11/15* (2006.01)
  *G11C 11/412* (2006.01)
  *H01L 43/08* (2006.01)
  *G11C 5/14* (2006.01)
  *G11C 11/417* (2006.01)
(52) U.S. Cl.
  CPC .......... *G11C 11/412* (2013.01); *G11C 11/417* (2013.01); *H01L 43/08* (2013.01); *G11C 2213/54* (2013.01)
(58) Field of Classification Search
  USPC ............................................ 365/154, 185.08
  See application file for complete search history.

(56) References Cited

U.S. PATENT DOCUMENTS

| | | | |
|---|---|---|---|
| 2015/0070975 A1 | 3/2015 | Yamamoto | |
| 2017/0229179 A1* | 8/2017 | Sugahara | ........... G11C 14/0081 |

FOREIGN PATENT DOCUMENTS

| | | |
|---|---|---|
| JP | 2015-035653 | 2/2015 |
| WO | WO 2013/172065 | 11/2013 |

* cited by examiner

F I G. 1
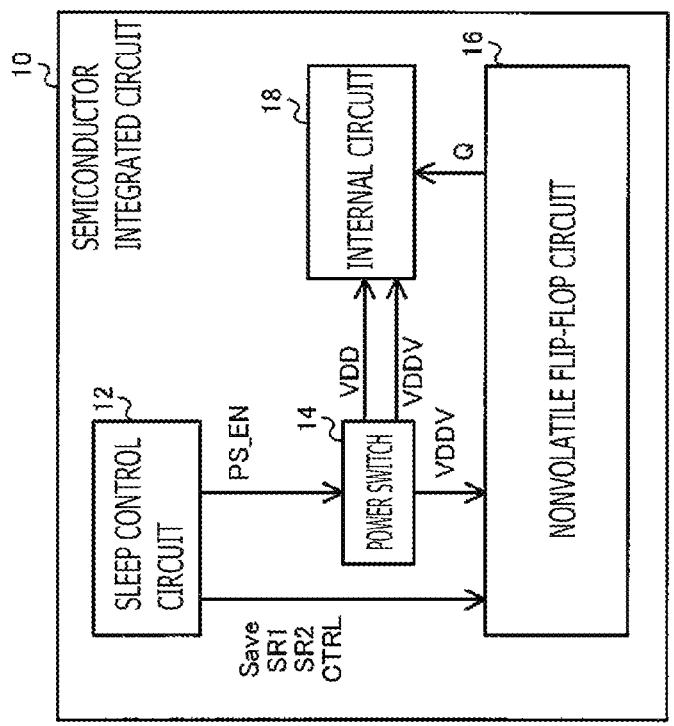

SEMICONDUCTOR DEVICE TO REDUCE ENERGY CONSUMED TO WRITE DATA

CROSS REFERENCE TO RELATED APPLICATIONS

This application is a national stage application under 35 U.S.C. 371 and claims the benefit of PCT Application No. PCT/JP2016/067196 having an international filing date of 9 Jun. 2016, which designated the United States, which PCT application claimed the benefit of Japanese Patent Application No. 2015-126834 filed 24 Jun. 2015, the disclosures of which are incorporated herein by reference in their entirety.

TECHNICAL FIELD

The present invention relates to a semiconductor device.

BACKGROUND ART

Generally, so-called power gating has been known as a technology that reduces the power consumption of a large scale integration circuit (LSI), i.e., a technology for cutting off the source voltage supplied to circuits inside a semiconductor chip (internal circuits) and placing the internal circuits into what is known as a sleep state. The techniques related to power gating include one that prevents an internal state or internal data from being erased upon cutoff of the source voltage. For example, PTL 1 describes a technique by which a volatile register and a nonvolatile register are provided. According to this technique, data is saved from the volatile register to the nonvolatile register when the supply of the source voltage is cut off, and the data is restored from the nonvolatile register to the volatile register when the supply of the source voltage is resumed.

For example, PTL 2 describes a nonvolatile flip-flop circuit that uses magnetic tunnel junction (MTJ) elements making up a nonvolatile storing section for storing the internal state and internal data when the supply of the source voltage is cut off.

FIG. 11 depicts a typical circuit diagram of an existing nonvolatile flip-flop circuit that uses MTJ elements constituting a nonvolatile storing section. A nonvolatile flip-flop circuit 1016 depicted in FIG. 11 includes a master latch 1030, a slave latch 1032, positive metal-oxide semiconductor (PMOS) transistors P5 and P6, and MTJ elements MTJ1 and MTJ2. The master latch 1030 includes inverters IV1 and IV2, a Not-And (NAND) circuit NAND1, and transfer gates TG1 to TG3. Further, the slave latch 1032 includes inverters IV5 and IV6, a PMOS transistor P7, a NAND circuit NAND2, and a transfer gate TG4. The transfer gates TG1 to TG4 are controlled by a clock signal CB obtained by an inverter IV10 inverting a clock signal CLK and by a clock signal C (with the same logical value as that of the clock signal CLK) acquired by an inverter IV11 inverting the output of the inverter IV10.

In the existing nonvolatile flip-flop circuit 1016 depicted in FIG. 11, if the supply of the source voltage is to be cut off by power gating, the logical value of a control signal SR is set to "0" to turn on the PMOS transistors P5 to P7 whose gate is impressed with the control signal SR. Then logical values "1" and "0" of a control signal CTRL are fed consecutively, thereby writing one-bit information held in the slave latch 1032 to the MTJ elements MTJ1 and MTJ2. At the end of power gating, the supply of the source voltage is resumed, and the logical value of the control signal SR is set to "0" to turn on the PMOS transistors P5 to P7. This permits restoration into the slave latch 1032 of the internal circuit state applicable when the above-described write operation was performed, through the use of a difference in resistance value between the MTJ elements MTJ1 and MTJ2.

CITATION LIST

Patent Literature

[PTL 1]
  JP 2014-225251A
[PTL 2]
  JP 2015-35653A

SUMMARY

Technical Problem

The nonvolatile flip-flop circuit 1016 depicted in FIG. 11 allows the MTJ elements MTJ1 and MTJ2 to retain the data after the supply of the source voltage is cut off (nonvolatile data retention). A power gating operation is then performed to put into the sleep state the nonvolatile flip-flop circuit 1016 and the internal circuits driven by an output signal Q, thereby reducing energy consumption. Also, the internal circuit state and internal data are retained before and after the power gating operation.

One problem, however, is that the existing nonvolatile flip-flop circuit 1016 such as depicted in FIG. 11 consumes a large amount of energy when data is written to the MTJ elements MTJ1 and MTJ2.

That is, when the nonvolatile flip-flop circuit 1016 stores the retained data into the MTJ elements MTJ1 and MTJ2 upon power gating, it is necessary to let a relatively large current flow to the MTJ elements MTJ1 and MTJ2. The large current flowing to the MTJ elements MTJ1 and MTJ2 entails a large amount of energy consumed by the write operation to the MTJ elements MTJ1 and MTJ2. If the period of power gating (sleep period) is relatively short, an energy overhead of the write operation to the MTJ elements MTJ1 and MTJ2 may incur an inordinate increase in energy consumption despite the supply of the source voltage being cut off. Even if the sleep period is relatively long, a large amount of energy necessary for the write operation to the MTJ elements MTJ1 and MTJ2 may diminish the amount of energy consumption that could be saved by power gating.

The present invention has been devised to solve the above problem. An object of the invention is therefore to provide a semiconductor device capable of reducing the amount of energy consumed to write data to the nonvolatile storing section.

Solution to Problem

According to a first aspect of the present invention, there is provided a semiconductor device including: a flip-flop; a nonvolatile storing section configured to store data held in the flip-flop; and a write control section configured to perform control to write the data held in the flip-flop to the nonvolatile storing section if, with supply of a source voltage or a ground voltage to the own device cut off, the data stored in the nonvolatile storing section does not coincide with the data held in the flip-flop, the write control section further performing control not to write the data held in the flip-flop to the nonvolatile storing section if the data stored in the nonvolatile storing section coincides with the data held in the flip-flop.

According to a second aspect of the present invention, in the semiconductor device according to the first aspect above, the write control section retains the data stored in the nonvolatile storing section, and performs the control based on the result of a comparison between the retained data and the data held in the flip-flop.

According to a third aspect of the present invention, the semiconductor device according to the first or the second aspect above further includes a first switch element configured to switch connection and disconnection between the flip-flop and the nonvolatile storing section. The write control section causes the first switch element to connect the flip-flop with the nonvolatile storing section when performing control to write the data, the write control section further causing the first switch element to disconnect the flip-flop from the nonvolatile storing section when performing control not to write the data.

According to a fourth aspect of the present invention, the semiconductor device according to any one of the first to the third aspects above further includes a restoring section configured to restore the data written to the nonvolatile storing section in accordance with an externally input restoration control signal in order to restore the data written to the nonvolatile storing section upon resumption of the supply of the source voltage or the ground voltage previously cut off to the own device.

According to a fifth aspect of the present invention, the semiconductor device according to any one of the first to the fourth aspects above, the restoring section includes a second switch element configured to switch connection and disconnection between the flip-flop and the nonvolatile storing section in accordance with the restoration control signal.

According to a sixth aspect of the present invention, in the semiconductor device according to any one of the first to the fifth aspects above, the nonvolatile storing section is a magnetic tunnel junction element.

Advantageous Effect of Invention

The present invention thus provides an advantageous effect of reducing the amount of energy consumed to write data to the nonvolatile storing section.

BRIEF DESCRIPTION OF DRAWINGS

FIG. 1 is a block diagram depicting a typical semiconductor device of a first embodiment.

DESCRIPTION OF EMBODIMENTS

Figure 2:
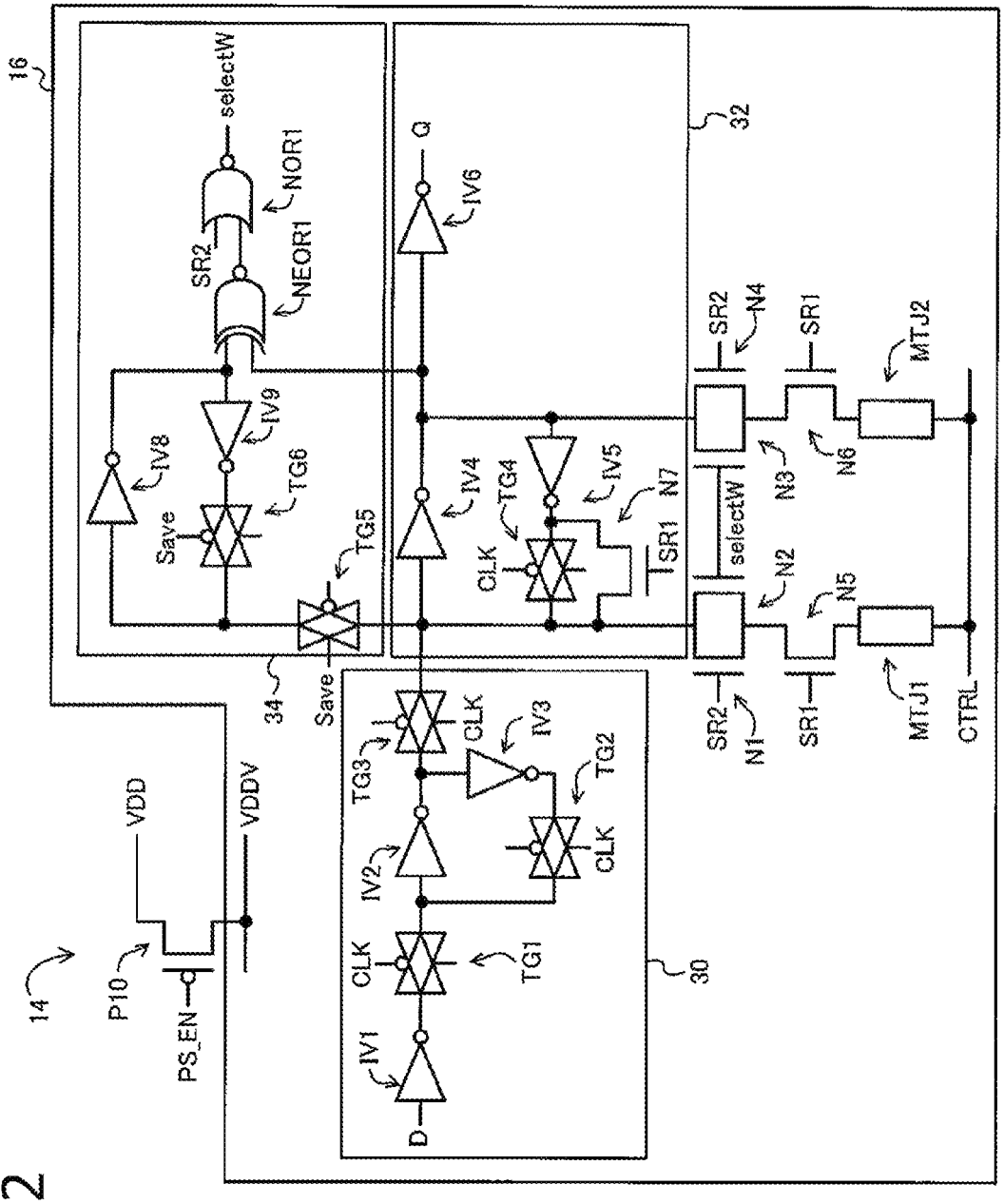
FIG. 2 is a circuit diagram of a nonvolatile flip-flop circuit of the first embodiment.

Some preferred embodiments of the present invention are described below with reference to the accompanying drawings. Note that throughout the drawings, like reference characters designate like parts with like functions of which the explanations will be omitted hereunder where redundant.

First Embodiment

Explained first is how the semiconductor integrated circuit of the embodiment is configured. FIG. 1 is a block diagram depicting a typical semiconductor integrated circuit 10 of the embodiment.

The semiconductor integrated circuit 10 of the embodiment includes a sleep control circuit 12, a power switch 14, a nonvolatile flip-flop circuit 16, and an internal circuit 18.

The semiconductor integrated circuit 10 of the embodiment has the function of reducing power consumption by cutting off the supply of a source voltage VDDV to the internal circuit 18 and other parts, i.e., by causing the relevant circuits to enter the so-called sleep state.

The sleep control circuit 12 has the function of controlling the sleep state (i.e., controlling how the source voltage VDDV is supplied). The sleep control circuit 12 of the embodiment outputs a sleep control signal PS_EN to the power switch 14. The sleep control circuit 12 also outputs to the nonvolatile flip-flop circuit 16 control signals Save, SR1, SR2, and CTRL of which the details will be discussed later.

The power switch 14 has the function of cutting off the supply of the source voltage VDDV in accordance with the sleep control signal PS_EN. As depicted in FIG. 2, the power switch 14 of the embodiment typically uses a PMOS transistor P10. The gate of the PMOS transistor P10 is connected with the sleep control circuit 12. The sleep control signal PS_EN is input to the gate of the PMOS transistor P10 from the sleep control circuit 12.

The source of the PMOS transistor P10 is connected with a power line that supplies a source voltage VDD. The drain of the PMOS transistor P10 is connected with a power line that supplies the source voltage VDDV. In the semiconductor integrated circuit 10 of the embodiment, the circuits not entering the sleep state are driven by the source voltage VDD; the circuits going into the sleep state are driven by the source voltage VDDV. In the embodiment, a circuit region capable of transitioning to the sleep state upon power gating under control of the sleep control circuit 12 (i.e., a circuit region driven by the source voltage VDDV) is referred to as "power gating (PG) region."

Specifically, in a normal state where the normal operation is performed, the sleep control circuit 12 outputs the sleep control signal PS_EN with a logical value of "0" (Low level) to the power switch 14. The signal thereby turns on the PMOS transistor P10 of the power switch 14, supplying the source voltage VDDV. On the other hand, in the sleep state during power gating, the sleep control circuit 12 outputs the sleep control signal PS_EN with a logical value of "1" (High level) to the power switch 14. The signal thereby turns off the PMOS transistor P10 of the power switch 14. This cuts off the supply of the source voltage VDDV and stops the circuits in the PG region from being driven by the source voltage VDDV, thereby bringing about the sleep state.

The internal circuit 18 is not limited to anything specific. This may be a circuit with functionality meeting the user's requirements. The internal circuit 18 may include multiple functions (circuits). Also, the internal circuit 18 may include either a circuit driven by the source voltage VDD or a circuit (PG region) driven by the source voltage VDDV, or both.

The nonvolatile flip-flop circuit 16 functioning as the semiconductor device of the present invention has the function of holding (latching) an input signal D and outputting an output signal Q corresponding to the input signal D (i.e., the output signal having the same logical value (level) as the input signal D). The nonvolatile flip-flop circuit 16 of the embodiment is in the PG region and driven by the source voltage VDDV.

FIG. 2 is a circuit diagram of the nonvolatile flip-flop circuit 16 of the embodiment. As depicted in FIG. 2, the nonvolatile flip-flop circuit 16 of this embodiment includes a D-type flip-flop master latch 30, a D-type flip-flop slave latch 32, and a write control circuit 34.

The master latch 30 has the function of capturing and latching the input signal D input from outside of the nonvolatile flip-flop circuit 16 in time with the clock signal CLK.

The master latch 30 includes inverters IV1 to IV3 and transfer gates TG1 to TG3. The input signal D is input to the inverter IV1 from outside of the nonvolatile flip-flop circuit 16.

The transfer gates TG1 to TG3 are controlled to be turned on and off in accordance with the clock signal CLK. The timing for turning on and off the transfer gate TG1 in time with the clock signal CLK is inverse to the timing for turning on and off the transfer gates TG2 and TG3 in accordance with the clock signal CLK.

The slave latch 32 has the function of capturing and latching the data output from the master latch 30 in time with the clock signal CLK, before outputting the output signal Q with the same logical value as the input signal D to outside of the nonvolatile flip-flop circuit 16.

The slave latch 32 includes inverters IV4 to IV6, a transfer gate TG4, and a negative metal-oxide semiconductor (NMOS) transistor N7. The transfer gate TG4 is controlled to be turned on and off in time with the clock signal CLK. The NMOS transistor N7 is controlled to be turned on and off in accordance with the control signal SR1. The timing for turning on and off the transfer gate TG1 in time with the clock signal CLK is the same as the timing for turning on and off the transfer gate TG4 in accordance with the clock signal CLK.

The inverter IV6 in the slave latch 32 outputs the output signal Q to outside of the nonvolatile flip-flop circuit 16 (i.e., to the internal circuit 18).

Explained below is the flip-flop operation performed by the master latch 30 and the slave latch 32 of the embodiment.

When the logical value of the clock signal CLK is changed from "1" to "0," the transfer gates TG1 and TG4 are turned on and the transfer gates TG2 and TG3 are turned off. This causes the master latch 30 to capture the input signal D and the slave latch 32 to hold the signal captured before the logical value of the clock signal CLK was changed to "0."

When the logical value of the clock signal CLK is changed from "0" to "1," the transfer gates TG1 and TG4 are turned off and the transfer gates TG2 and TG3 are turned on. This causes the master latch 30 to hold the signal captured before the logical value of the clock signal CLK was changed to "1" and the slave latch 32 to capture the signal output from the transfer gate TG3 of the master latch 30, with the inverter IV6 outputting the output signal Q having the same logical value as the captured signal.

The write control circuit 34 of the embodiment temporarily retains the same data as that written to the MTJ elements MTJ1 and MTJ2, and compares the retained data with the data currently held in the slave latch 32. Based on the result of the comparison, the write control circuit 34 controls whether or not to write to the MTJ elements MTJ1 and MTJ2 the data being held in the slave latch 32. If the data held in the MTJ elements MTJ1 and MTJ2 coincides with the data held in the slave latch 32, the write control circuit 34 performs control not to write the data to the MTJ elements MTJ1 and MTJ2.

Specifically, the write control circuit 34 of the embodiment includes inverters IV8 and IV9, transfer gates TG5 and TG6, a two-input Not-Exclusive-OR (NEOR) circuit NEOR1, and a two-input Not-OR (NOR) circuit NOR1, as depicted in FIG. 2.

The input terminal of the transfer gate TG5 is connected with the input terminal of the inverter IV4 in the slave latch 32 (i.e., with the output terminal of the transfer gate TG3 in the master latch 30). The output terminal of the transfer gate TG5 is connected with the input terminal of the inverter IV8 and with the output terminal of the transfer gate TG6. The output terminal of the inverter IV9 is connected with the input terminal of the transfer gate TG6. The transfer gates TG5 and TG6 are controlled to be turned on and off in accordance with the control signal Save. The timing for turning on and off the transfer gate TG5 in time with the control signal Save is inverse to the timing for turning on and off the transfer gate TG6 in accordance with the control signal Save.

One input terminal of the NEOR circuit NEOR1 is connected with the output terminal of the inverter IV8 and with the input terminal of the inverter IV9. The other input terminal of the NEOR circuit NEOR1 is connected with the output terminal of the inverter IV4 in the slave latch 32 (i.e., with the input terminal of the inverter IV6).

The control signal SR2 is input to one input terminal of the NOR circuit NOR1. The other input terminal of the NOR circuit NOR1 is connected with the output terminal of the NEOR circuit NEOR1. The NOR circuit NOR1 outputs an output signal selectW.

As depicted in FIG. 2, the nonvolatile flip-flop circuit 16 of the embodiment further includes MTJ elements MTJ1 and MTJ2 and NMOS transistors N1 to N6. Incidentally, the NMOS transistors N2 and N3 are an example of a first switch element of the present invention, and the NMOS transistors N1 and N4 are an example of a restoring section and a second switch element of this invention. The control signal SR2 input to the NMOS transistors N1 and N4 is an example of a restoration control signal of the present invention.

Figure 3:
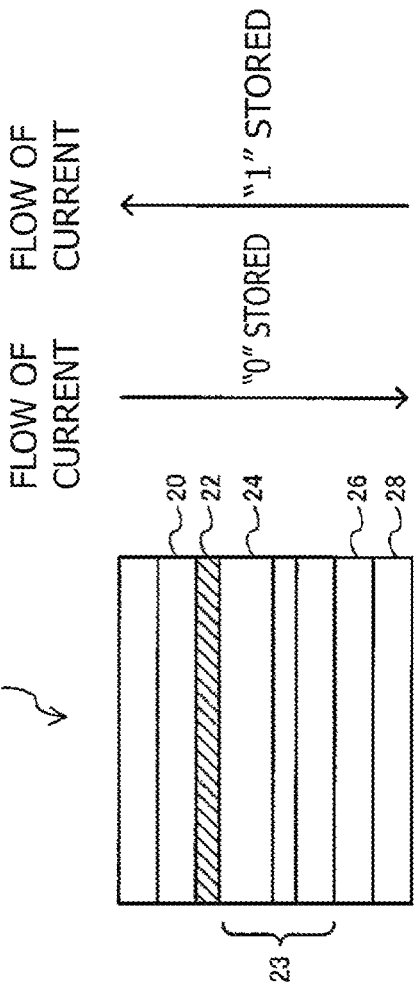
FIG. 3 is a schematic cross-sectional diagram for explaining the layer composition and operations of MTJ elements of the first embodiment.
Figure 4:
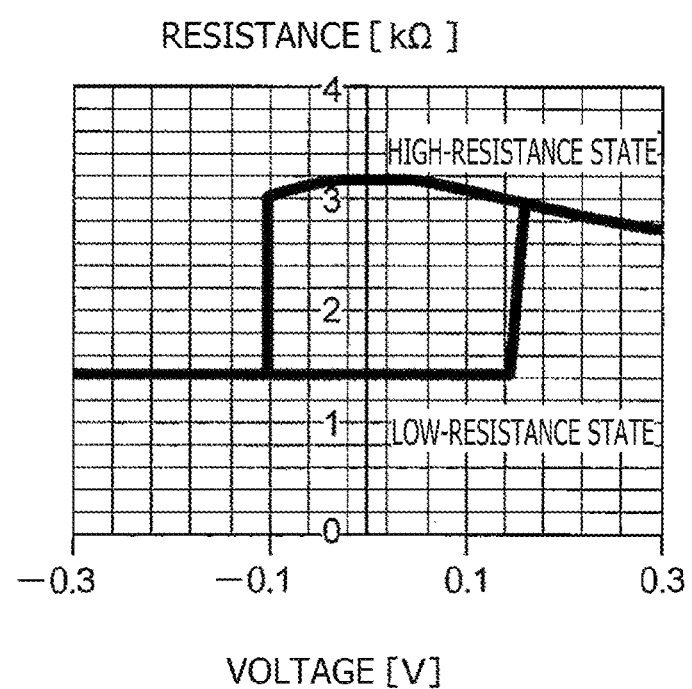
FIG. 4 is a voltage-versus-resistance graph for explaining the operations of the MTJ elements of the first embodiment.

Explained below are the MTJ elements MTJ1 and MTJ2 as a typical nonvolatile storing section of the present invention. FIG. 3 is a schematic cross-sectional diagram for explaining the layer composition and operations of the MTJ elements MTJ1 and MTJ2 of the embodiment. FIG. 4 is a voltage-versus-resistance graph for explaining the operations of the MTJ elements MTJ1 and MTJ2 of this embodiment. As depicted in FIG. 3, each MTJ element includes a free layer 20 which has magnetic properties and of which the magnetic direction changes, a synthetic anti-ferromagnetic (SAF) pinned layer 23 which also has magnetic properties and of which the magnetic direction is constant, and a tunnel barrier layer 22 disposed between the free layer 20 and the pinned layer 23. The pinned layer 23 includes a reference layer 24. The MTJ element further includes an under layer 26 and a bottom electrode 28.

As depicted in FIG. 4, each MTJ element has its resistance value changed in accordance with the magnitude of the voltage applied to the MTJ element. Thus if a current is caused to flow from the free layer 20 to the pinned layer 23, the magnetic direction of the free layer 20 becomes the same as that of the pinned layer 23. This causes the MTJ element to have a low resistance and brings about a state where data with a logical value of "0" is retained. On the other hand, if a current is caused to flow from the pinned layer 23 to the free layer 20, the magnetic direction of the free layer 20 is made opposite to that of the pinned layer 23. This causes the MTJ element to have a high resistance and brings about a state where data with a logical value of "1" is retained.

The data (information) written to the MTJ element is retained when the supply of the source voltage VDDV is cut off. Thus upon power gating, before transition to the sleep state with the source voltage VDDV cut off, the nonvolatile flip-flop circuit 16 of the embodiment writes the data held in the slave latch 32 to the MTJ elements MTJ1 and MTJ2 for storage therein. Upon emerging from the sleep state, the nonvolatile flip-flop circuit 16 reads the data written in the MTJ elements MTJ1 and MTJ2 out to the slave latch 32 for data restoration.

Incidentally, in the embodiment, the operation of putting the data held in the slave latch 32 into the MTJ elements MTJ1 and MTJ2 is referred to as "store," and the operation of reading the data from the MTJ elements MTJ1 and MTJ2 and putting it back into the slave latch 32 is referred to as "restore."

The ends of the MTJ elements MTJ1 and MTJ2 in the embodiment on the side of the free layer 20 are connected with a control signal line on which the control signal CTRL flows. The end of the MTJ element MTJ1 on the side of the pinned layer 23 is connected with one end (source) of the NMOS transistor N5. The end of the MTJ element MTJ2 on the side of the pinned layer 23 is connected with one end (source) of the NMOS transistor N6.

One end (source) of the NMOS transistor N5 is connected with the MTJ element MTJ1. The other end (drain) of the NMOS transistor N5 is connected with one end (source) of the NMOS transistors N1 and N2. One end (source) of the NMOS transistor N6 is connected with the MTJ element MTJ2. The other end (drain) of the NMOS transistor N6 is connected with one end (source) of the NMOS transistors N3 and N4. The NMOS transistors N5 and N6 are controlled to be turned on and off in accordance with the control signal SR1.

The other end (drain) of the NMOS transistors N1 and N2 is connected with the slave latch 32 (input terminal of the inverter IV4). The other end of the NMOS transistors N3 and N4 is connected with the slave latch 32 (output terminal of the inverter IV4). The NMOS transistors N1 and N4 are controlled to be turned on and off in accordance with the control signal SR2. The NMOS transistors N2 and N3 are controlled to be turned on and off in accordance with the output signal selectW output from the write control circuit 34.

Figure 5:
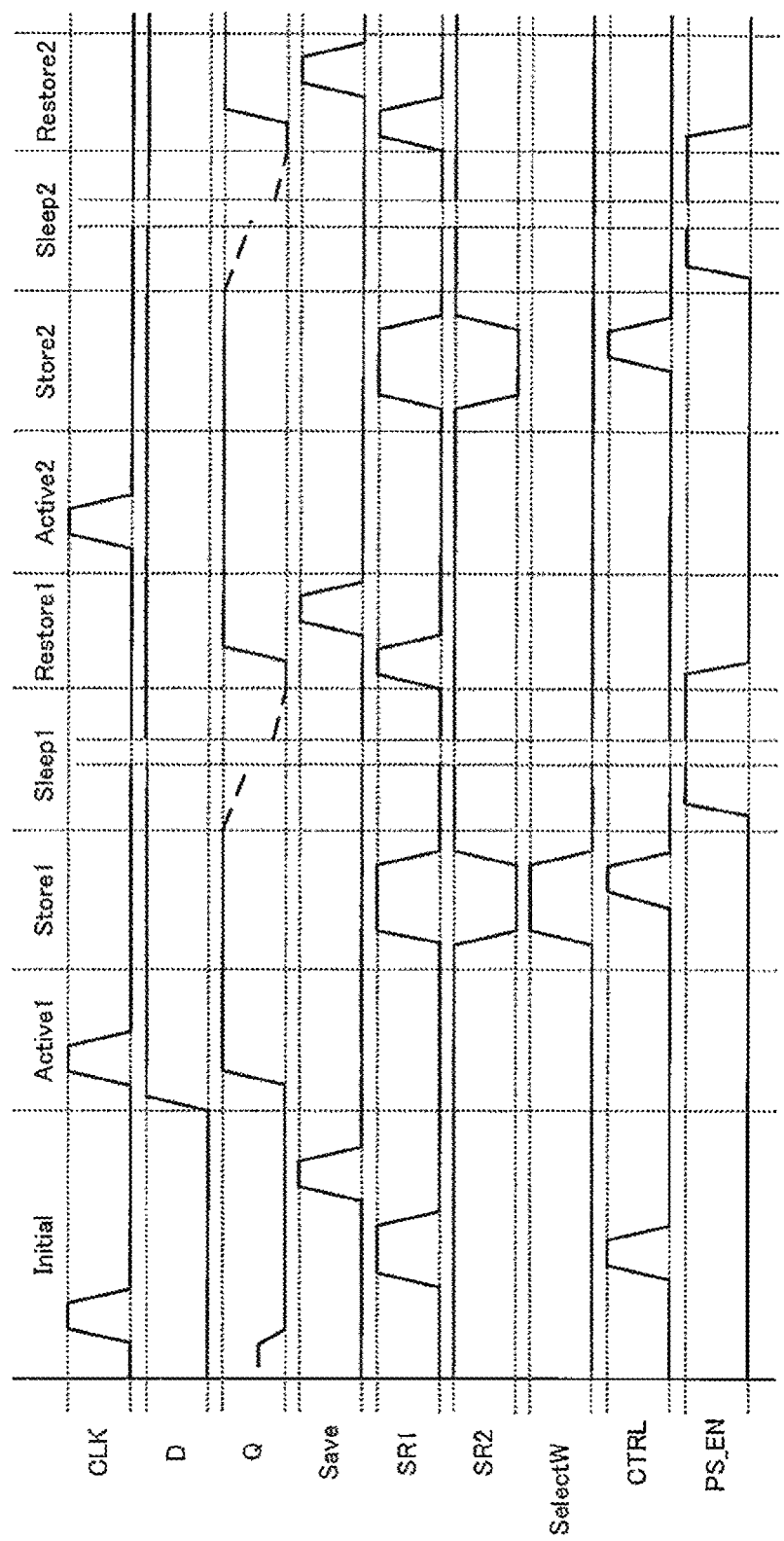
FIG. 5 is a timing diagram depicting a control sequence applicable when the logical value of an input signal D for the nonvolatile flip-flop circuit of the first embodiment is "1."

Explained below is the operation of the nonvolatile flip-flop circuit 16 of the embodiment. FIG. 5 is a timing diagram depicting a control sequence of the nonvolatile flip-flop circuit 16 of this embodiment. FIG. 5 depicts a case in which the input signal D with a logical value of "1" (High level) is captured and retained by the nonvolatile flip-flop circuit 16.

In an Initial state, the logical value of the control signal SR2 input to the nonvolatile flip-flop circuit 16 from the sleep control circuit 12 is "1." Meanwhile, the MTJ elements MTJ1 and MTJ2 are initialized when the logical value of the control signal SR1 is changed from "0" to "1," with the logical value of the control signal CTRL changed from "0" to "1" and then from "1" to "0" while the logical value of the control signal SR1 is "1." After the MTJ elements MTJ1 and MTJ2 are initialized, the logical value of the control signal SR1 is again set to "0." After the data held in the write control circuit 34 is initialized by setting the logical value of the control signal Save to "1," the logical value of the control signal Save is again set to "0."

Then comes a transition to an Active state where the input signal D is captured into the master latch 30 and the slave latch 32. In an Active 1 state depicted in FIG. 5, the logical value of the control signal SR1 and that of the control signal Save are set to "0" each. Because the logical value of the control signal SR1 is set to "0," the NMOS transistor N7 is turned off. With the logical value of the control signal Save set to "0," the transfer gate TG5 is turned off and the transfer gate TG6 is turned on.

In the above state, toggling the clock signal CLK causes the master latch 30 and the slave latch 32 to operate as an ordinary flip-flop each, capturing and retaining the input signal D as described above.

In order to perform power gating next, the data held in the slave latch 32 is stored into the MTJ elements MTJ1 and MTJ2. This operation is carried out in a Store state. In the Store state, the logical value of the control signal SR1 is set to "1" and the logical value of the control signal SR2 is set to "0." The following two Store states take place:

One Store state is a Store 1 state depicted in FIG. 5. This state occurs when the data held in the write control circuit 34 (data held in the MTJ elements MTJ1 and MTJ2) is different from the data held in the slave latch 32.

The data held in the write control circuit 34 is input to one input terminal of the NEOR circuit NEOR1 from the inverter IV8. The data held in the slave latch 32 is input to the other input terminal of the NEOR circuit NEOR1 from the inverter IV4. If the levels of the two data items do not coincide with each other, the NEOR circuit NEOR1 outputs a signal with a logical value of "0." Thus the control signal SR2 with a logical value of "0" is input to one input terminal of the NOR circuit NOR1, and the signal with the logical value of "0" is input to the other input terminal of the NOR circuit NOR1 from the NEOR circuit NEOR1. Consequently, the logical value of the output signal selectW output from the NOR circuit NOR1 is "1."

With the logical value of the output signal selectW set to "1," the NMOS transistor N2 and N3 are turned on. With the logical value of the control signal SR1 set to "1" and with the NMOS transistors N5 to N7 turned on, changing the logical value of the control signal CTRL from "0" to "1" and then from "1" to "0" causes a current to flow between the slave latch 32 and the MTJ elements MTJ1 and MTJ2. This causes the data held in the slave lath 32 to be written to the MTJ elements MTJ1 and MTJ2. In this case, writing energy is consumed due to the current flowing to the MTJ elements MTJ1 and MTJ2.

The other Store state is a Store 2 state indicated in FIG. 5. This state occurs when the data held in the write control circuit 34 coincides with the data retained in the slave latch 32.

If the levels of the two input data items coincide with each other, the NEOR circuit NEOR1 outputs a signal with a logical value of "1." In this case, the control signal SR2 with a logical value of "0" is input to one input terminal of the NOR circuit NOR1, and the signal with a logical value of "1" is input to the other input terminal of the NOR circuit NOR1 from the NEOR circuit NEOR1. Consequently, the logical value of the output signal selectW output from the NOR circuit NOR1 is "0."

With the logical value of the output signal selectW set to "0," the NMOS transistor N2 and N3 are turned off. Because the NMOS transistors N1 and N4 are also turned off, no current path is formed between the slave latch 32 and the MTJ element MTJ1 and MTJ2 even when the NMOS transistors N5 and N6 are turned on, so that no data is written to the MTJ elements MTJ1 and MTJ2. Because no current flows to the MTJ elements MTJ1 and MTJ2 at this point, the writing energy is not consumed.

The operations in the Store state are followed by a transition to a Sleep state. In the Sleep state, the logical value of the sleep control signal PS_EN is set to "1." This turns off the PMOS transistor P10 of the power switch 14 to cut off the supply of the source voltage to the PG region (source voltage VDDV). While the source voltage is being cut off, the circuits of the PG region are discharged by leakage. This brings the voltage of each node in the slave latch 32 to 0 V. As a result, the logical value of the output signal Q gradually changes from "1" to "0" as depicted in FIG. 5.

Also in the Sleep state, the logical value of the control signal SR1 is "0." Thus the NMOS transistors N5 and N6 remain turned off.

With the Sleep state terminated, a restore operation is performed next to return to the normal operation. The restore operation is carried out in a Restore state (Restore 1 and Restore 2 in FIG. 5). In the Restore state, the logical value of the sleep control signal PS_EN is changed from "1" to "0," the logical value of the control signal SR1 is changed from "0" to "1," and the logical value of the control signal SR2 is fixed at "1."

In the case above, with the logical value of the sleep control signal PS_EN set to "0," the PMOS transistor P10 of the power switch 14 is turned on. This resumes the supply of the source voltage VDDV to the PG region. Because the logical value of the logical signal SR1 is set to "1," the NMOS transistors N5 to N7 are turned on. Also, with the logical value of the control signal SR2 set to "1," the NMOS transistors N1 and N4 are turned on. This causes the data held in the MTJ elements MTJ1 and MTJ2 to be written to the slave latch 32. As a result, the data held in the slave latch 32 before the source voltage VDDV was cut off is restored.

Also in the Restore state, the logical value of the control signal SR1 is changed from "1" to "0" and the logical value of the control signal Save is changed from "0" to "1" at the time the restoration of data to the slave latch 32 is completed. Because the logical value of the control signal SR1 is set to "0," the NMOS transistors N5 to N7 are turned off. With the logical value of the control signal Save set to "1," the transfer gate TG5 is turned on and the transfer gate TG6 is turned off. As a result, the same data as that restored to the slave latch 32 is stored into the write control circuit 34.

In the above-described activity of the nonvolatile flip-flop circuit 16 of the embodiment, the restore operation causes the latest data held in the MTJ elements MTJ1 and MTJ2 to be always retained in the write control circuit 34. Thus when a subsequent normal flip-flop operation (in the Active state) of the master latch 30 and the slave latch 32 is followed by another restore operation, the data held in the MTJ elements MTJ1 and MTJ2 is replaced with the data retained in the write control circuit 34.

In the store operation, the write control circuit 34 compares the internally retained data with the data held in the slave latch 32 to determine whether or not to write data to the MTJ elements MTJ1 and MTJ2. If the internally retained data coincides with the data held in the slave latch 32, the write control circuit 34 performs control not to write data to the MTJ elements MTJ1 and MTJ2. As a result, the nonvolatile flip-flop circuit 16 of the embodiment stops redundant write operations to the MTJ elements MTJ1 and MTJ2 and thereby reduces wasteful writing energy consumption.

Figure 6:
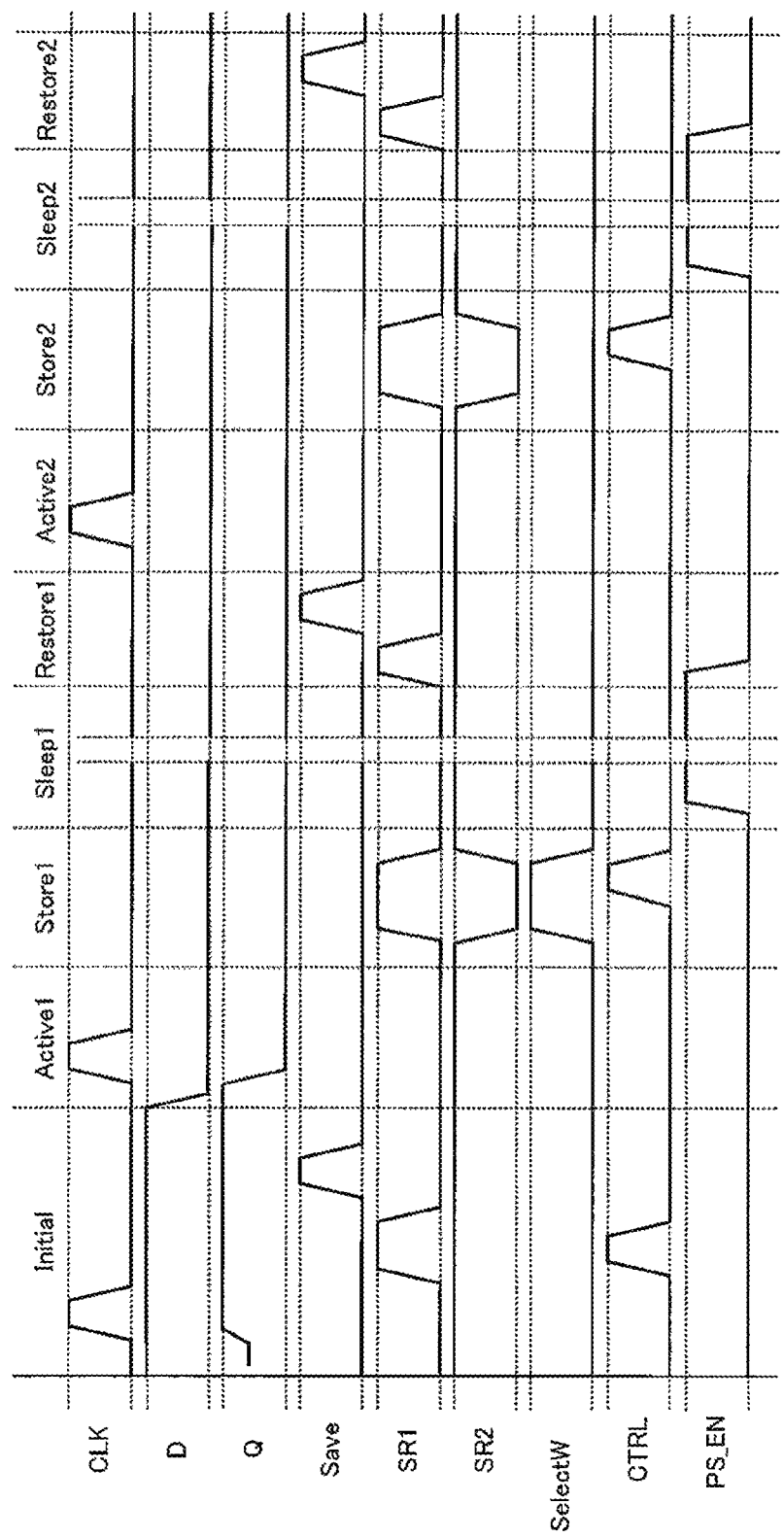
FIG. 6 is a timing diagram depicting a control sequence applicable when the logical value of the input signal D for the nonvolatile flip-flop circuit of the first embodiment is "0."

The foregoing paragraphs gave a detailed explanation, with reference to FIG. 5, of how the nonvolatile flip-flop circuit 16 works to capture and hold the input signal D with the logical value of "1." The explanation also applies to the nonvolatile flip-flop circuit 16 holding the input signal D with the logical value of "0." FIG. 6 is a timing diagram depicting a control sequence applicable when the logical value of the input signal D for the nonvolatile flip-flop circuit 16 of the embodiment is "0."

In an Active 1 state, as depicted in FIG. 6, toggling the clock signal CLK causes the master latch 30 and the slave latch 32 to operate in the same manner as in the normal flip-flop operation, capturing and holding the input signal D as discussed above. Because the logical value of the input signal D is "0," the logical value of the output signal Q is also "0" in the case depicted in FIG. 6. The logical value of the output signal Q is kept at "0" subsequent to the Store state. If the logical value of the output signal Q is "0," unlike when the logical value is "1" (see FIG. 5), the logical value remains unchanged at "0" in a Sleep state.

Where the input signal D with the logical value of "0" is retained, as depicted in FIG. 6, the operation of the nonvolatile flip-flop circuit 16, the states of various control signals output from the sleep control circuit 12, and the operation of the power switch 14 are the same as those described above with reference to FIG. 5 except that the logical value of the output signal Q is different. Thus these operations and states will not be discussed further in detail.

As described above, the semiconductor integrated circuit 10 (nonvolatile flip-flop circuit 16) of the embodiment suppresses redundant write operations to the MTJ elements MTJ1 and MTJ2 regardless of the logical value of the input signal D.

Second Embodiment

The nonvolatile flip-flop circuit 16 of the embodiment has the NMOS transistors N1 to N6, NEOR circuit NEOR1, and NOR circuit NOR1 arranged differently from the nonvolatile flip-flop circuit 16 of the first embodiment. The other structures of the nonvolatile flip-flop circuit 16 and the overall configuration of the semiconductor integrated circuit 10 are the same as in the first embodiment and thus will not be discussed further where redundant.

Figure 7:
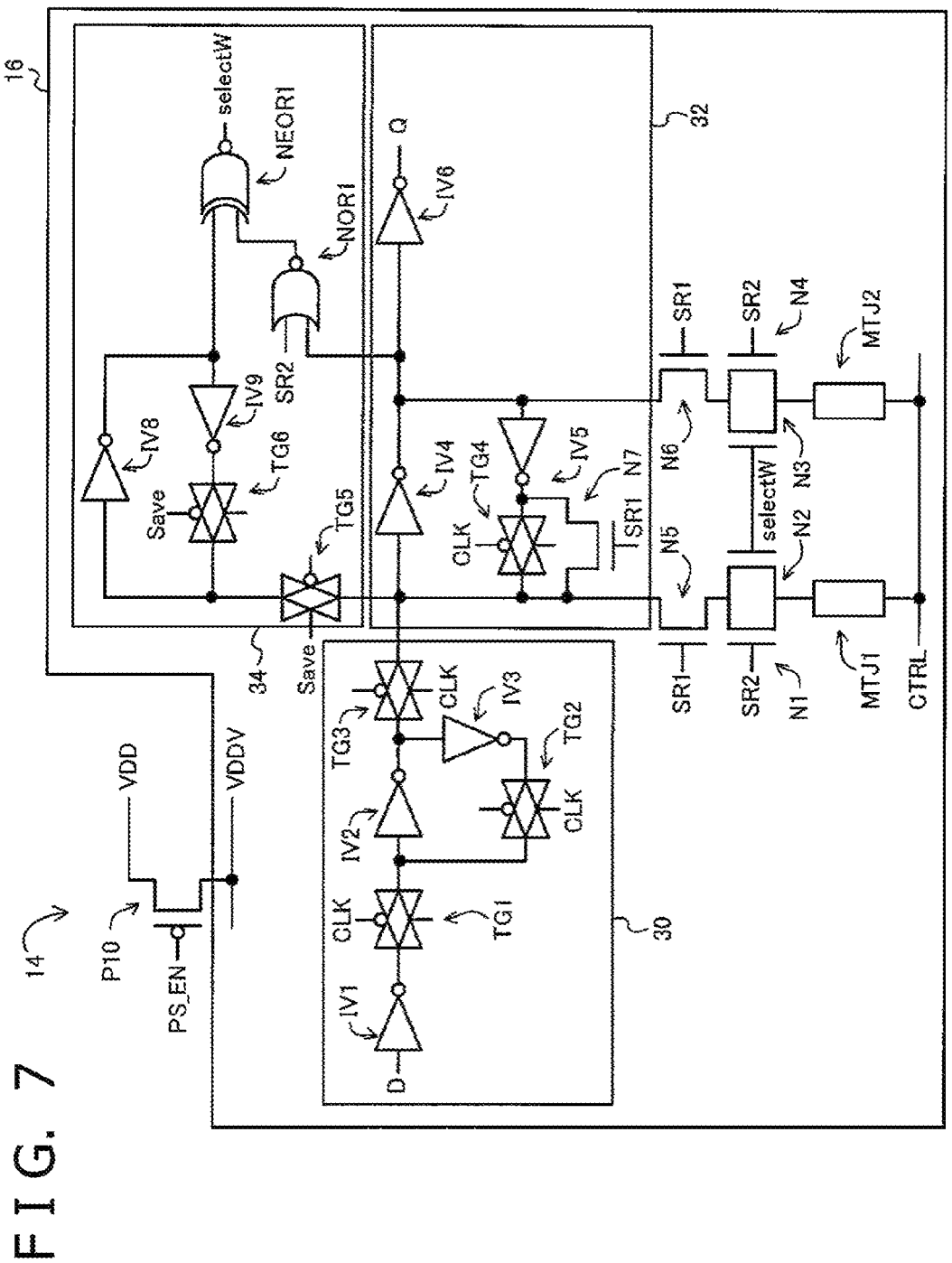
FIG. 7 is a circuit diagram of a nonvolatile flip-flop circuit of a second embodiment.

FIG. 7 is a circuit diagram of the nonvolatile flip-flop circuit of the embodiment. As sown in FIG. 7, the NMOS transistors N5 and N6 are connected with the slave latch 32, and the NMOS transistors N1 to N4 are connected with the MTJ elements MTJ1 and MTJ2.

Specifically, the other end (drain) of the NMOS transistor N5 is connected with the slave latch 32 (input terminal of the inverter IV4). The other end (drain) of the NMOS transistor N6 is connected with the slave latch 32 (output terminal of the inverter IV4). As in the first embodiment, the NMOS transistors N5 and N6 are controlled to be turned on and off in accordance with the control signal SR1.

The other end (drain) of the NMOS transistors N1 and N2 is connected with one end (source) of the NMOS transistor N5, and one end (source) of the NMOS transistors N1 and N2 is connected with the MTJ element MTJ1. The other end (drain) of the NMOS transistors N3 and N4 is connected with one end (source) of the NMOS transistor N6, and one end (source) of the NMOS transistors N3 and N4 is connected with the MTJ element MTJ2. As in the first embodiment, the NMOS transistors N1 and N4 are controlled to be turned on and off in accordance with the control signal SR2. The NMOS transistors N2 and N3 are controlled to be turned on and off in accordance with the output signal selectW output from the write control circuit 34.

Also in the nonvolatile flip-flop circuit 16 of the embodiment, the write control circuit 34 has the NEOR circuit NEOR1 and the NOR circuit NOR1 arranged differently therein.

As depicted in FIG. 7, the control signal SR2 is input to one input terminal of the NOR circuit NOR1. The output of the inverter IV4 is input to the other input terminal of the NOR circuit NOR1. The output of the inverter IV8 is input to one input terminal of the NEOR circuit NEOR1. The output of the NOR circuit NOR1 is input to the other input terminal of the NEOR circuit NEOR1. The NEOR circuit NEOR1 outputs the output signal selectW.

The operation of the nonvolatile flip-flop circuit 16 of the embodiment is explained below.

In the Store state discussed above in connection with the first embodiment, the logical value of the control signal SR2 is "0," so that the NOR circuit NOR1 outputs a signal obtained by inverting the logical value of the output signal from the inverter IV4. Thus if the data retained in the write control circuit 34 coincides with the data held in the slave latch 32, the two signals input to the NEOR circuit NEOR1 have different logical values. If the two data items do not coincide with each other, the two input signals to the NEOR circuit NEOR1 have the same logical value.

If the data retained in the write control circuit 34 coincides with the data held in the slave latch 32, the logical value of the output signal selectW from the NEOR circuit NEOR1 is "0." If the two data items do not coincide with each other, the logical value of the output signal selectW is "1." Thus the write control circuit 34 outputs the output signal selectW in the same manner as in the Store state discussed above in connection with the first embodiment.

As described above, when operated in the same control sequence discussed above in connection with the first embodiment (see FIGS. 2 and 6), the second embodiment provides the same functionality as that of the nonvolatile flip-flop circuit 16 of the first embodiment.

Third Embodiment

The third embodiment is explained below in conjunction with a case where PMOS transistors replace the NMOS transistors N1 to N7 used in the nonvolatile flip-flop circuit 16 of the above-mentioned embodiments. The same structures and operations as those of the nonvolatile flip-flop circuit 16 and the semiconductor integrated circuit 10 in the above-described embodiments will not be described further.

Figure 8:
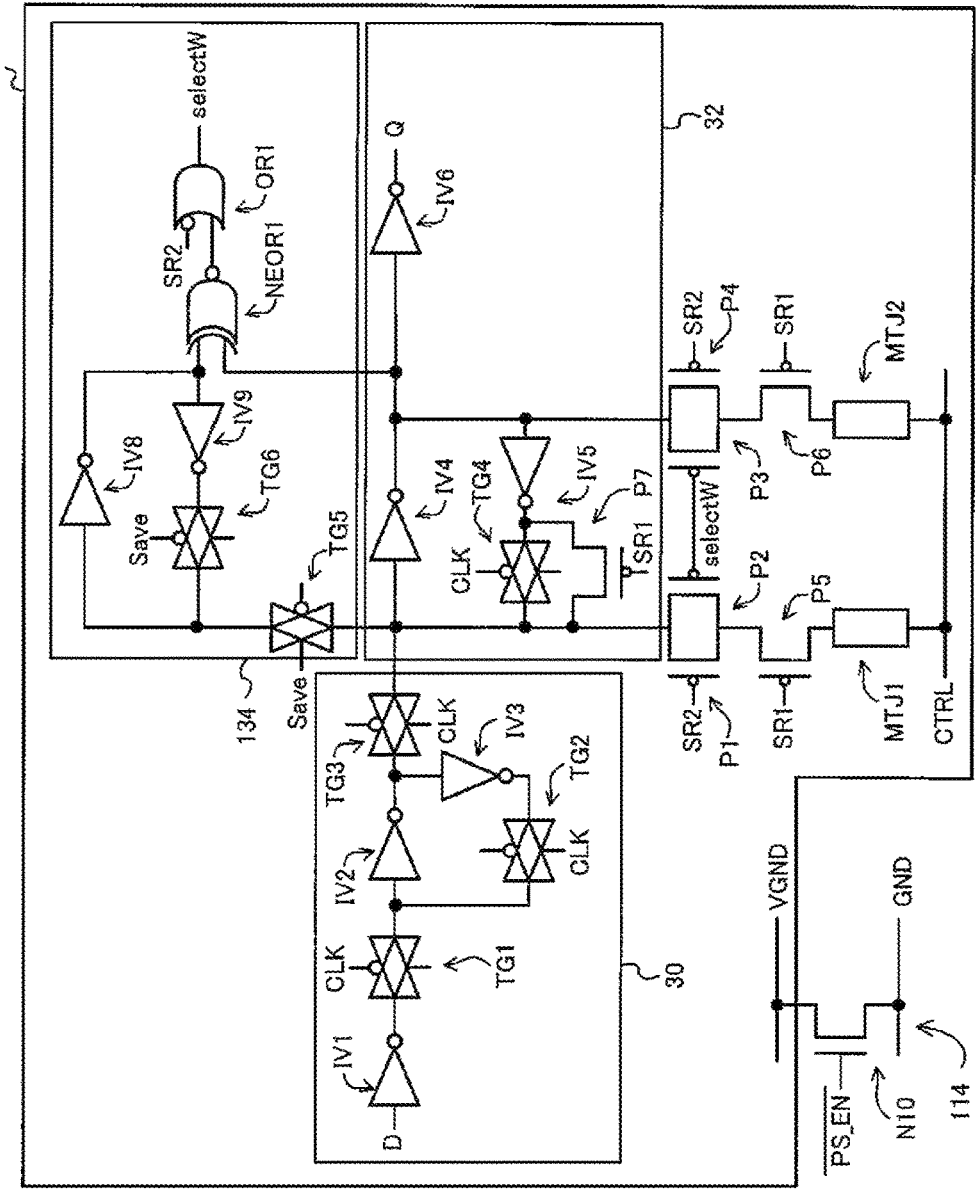
FIG. 8 is a circuit diagram of a nonvolatile flip-flop circuit of a third embodiment.

FIG. 8 is a circuit diagram of a nonvolatile flip-flop circuit of the embodiment. As depicted in FIG. 8, a nonvolatile flip-flop circuit 116 of the embodiment includes PMOS transistors P1 to P7 replacing the NMOS transistors N1 to N7 in the nonvolatile flip-flop circuit 16 of the embodiments above. Incidentally, the PMOS transistors P2 and P3 are an example of the first switch element of the present invention, and the PMOS transistors P1 and P4 are an example of the restoring section and the second switch element of this invention. The control signal SR2 input to the PMOS transistors P1 and P4 is an example of the restoration control signal of the present invention.

Thus in a semiconductor integrated circuit 110 of the embodiment, a power switch 114 differs from the power switch 14 of the embodiments above. The power switch 114 of the embodiment typically uses an NMOS transistor N10 as depicted in FIG. 8. An inverted signal obtained by inverting the logical value of the sleep control signal PS_EN output from the sleep control circuit 12 is input to the gate of the NMOS transistor N10.

In the normal state, a signal with a logical value of "1" (inverted signal of the sleep control signal PS_EN) is input to the NMOS transistor 10 to turn it on. This brings virtual ground (VGND) voltage down to ground (GND) voltage (VGND>GND). Meanwhile, upon power gating, a signal with a logical value of "0" (inverted signal of the sleep control signal PS_EN) is input to the NMOS transistor N10 to turn it off. This switches the GND voltage supplied to the PG region to the VGND voltage. That is, in the normal state (where the NMOS transistor N10 is turned on), the GND voltage is supplied as ground to the PG region. On the other hand, upon power gating (where the NMOS transistor N10 is turned off), the supply of the GND voltage is cut off, so that ground becomes the VGND voltage. In this case, VGND is larger than GND. Because the ground potential is raised, the PG region is stopped being driven and placed in the sleep state.

Furthermore, because the PMOS transistors P1 to P7 are used in the nonvolatile flip-flop circuit 116 of the embodiment, the logic circuits disposed in a write control circuit 134 of the embodiment are also different from those in the embodiments above.

As depicted in FIG. 8, the write control circuit 134 of the embodiment includes an NEOR circuit NEOR1 and an OR circuit OR1 as logic circuits.

The output of the inverter IV8 is input to one input terminal of the NEOR circuit NEOR1. The output of the inverter IV4 is input to the other input terminal of the NEOR circuit NEOR1. An inverted signal obtained by inverting the logical value of the control signal SR2 is input to one input terminal of the OR circuit OR1. The output of the NEOR circuit NEOR1 is input to the other input terminal of the OR circuit OR1. The OR circuit OR1 outputs the output signal selectW.

Figure 9:
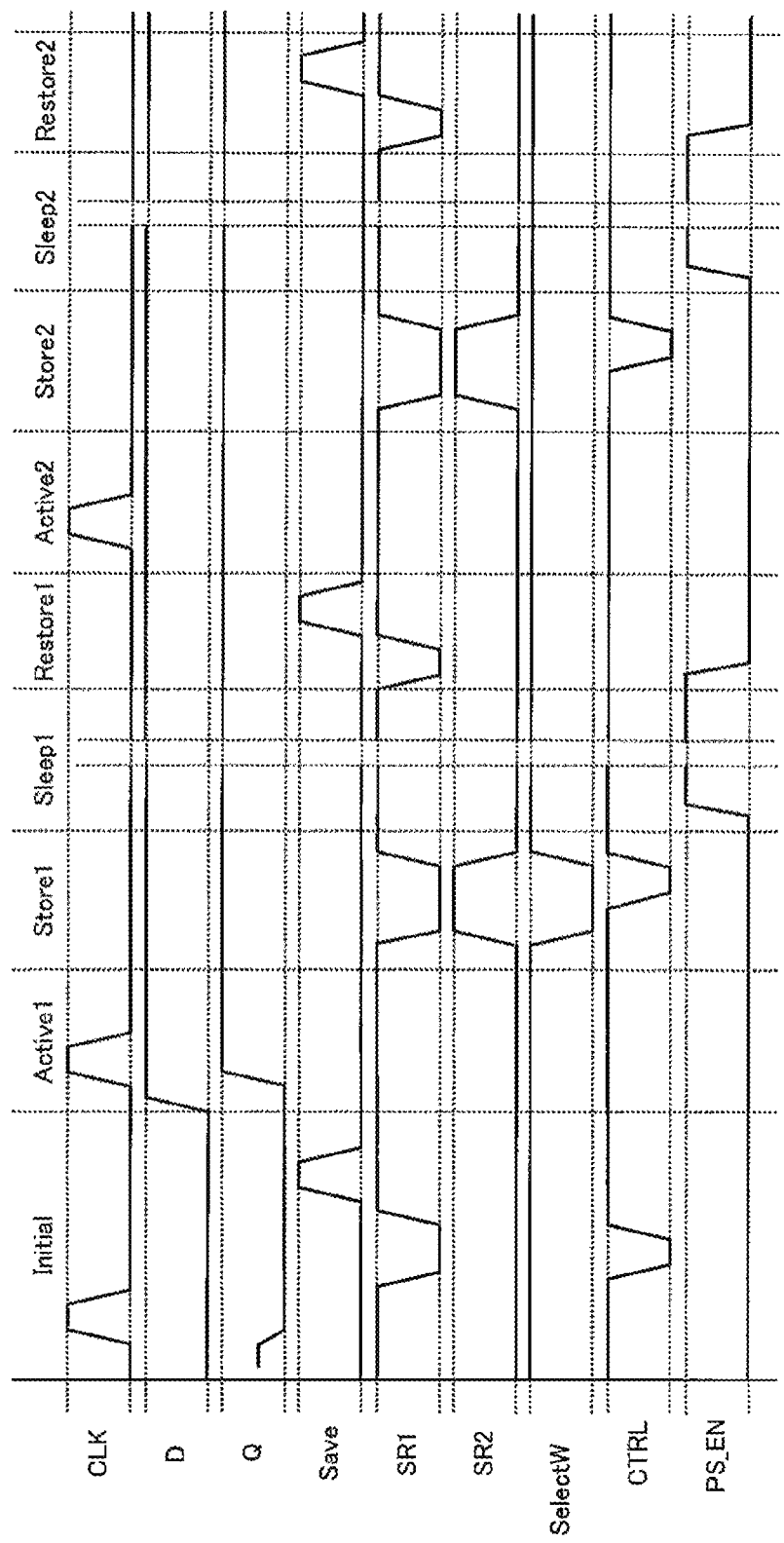
FIG. 9 is a timing diagram depicting a control sequence applicable when the logical value of the input signal D for the nonvolatile flip-flop circuit of the third embodiment is "1."

The operation of the nonvolatile flip-flop circuit 116 of the embodiment is explained below. FIG. 9 is a timing diagram depicting a control sequence of the nonvolatile flip-flop circuit 116 of the embodiment. FIG. 9 depicts a case where the input signal D with a logical value of "1" is captured and retained by the nonvolatile flip-flop circuit 116.

In an Initial state, the logical value of the control signal SR2 input to the nonvolatile flip-flop circuit 116 from the sleep control circuit 12 is "0." When the logical value of the control signal SR1 is changed from "1" to "0" and when the logical value of the control signal CTRL is changed from "1" to "0" and then from "0" to "1" while the logical value of the control signal SR1 is being "0," the MTJ elements MTJ1 and MTJ2 are initialized. After the MTJ elements MTJ1 and MTJ2 are initialized, the logical value of the control signal SR1 is again changed to "1." Also, after the data retained in the write control circuit 134 is initialized by setting the logical value of the control signal Save to "1," the logical value of the control signal Save is again set to "0."

Then comes a transition to an Active state in which the input signal D is captured into the master latch 30 and the slave latch 32. In an Active 1 state depicted in FIG. 9, the logical value of the control signal SR1 is set to "1" and the logical value of the control signal Save is set to "0." Because the logical value of the control signal SR1 is "1," the PMOS transistor P7 is turned off. In addition, because the logical value of the control signal Save is "0," the transfer gate TG5 is turned off and the transfer gate TG6 is turned on.

In the state above, toggling the clock signal CLK causes the master latch 30 and the slave latch 32 to operate in the same manner as an ordinary flip-flop, capturing and holding the input signal D as discussed above.

In order to perform power gating next, the data held in the slave latch 32 is first stored into the MTJ elements MTJ1 and MTJ2. In the Store state, the logical value of the control signal SR1 is set to "0" and the logical value of the control signal SR2 is set to "1."

Explained below is a Store 1 state in which the data held in the write control circuit 34 (i.e., data held in the MTJ elements MTJ1 and MTJ2) is different from the data retained in the slave latch 32.

The data held in the write control circuit 134 is input to one input terminal of the NEOR circuit NEOR1 from the inverter IV8. The data held in the slave latch 32 is input to the other input terminal of the NEOR circuit NEOR1 from the inverter IV4. If the levels of the two input data items do not coincide with each other, the NEOR circuit NEOR1 outputs a signal with a logical value of "0."

Because the logical value of the control signal SR2 is "1," a signal with a logical value of "0" obtained by inverting the control signal SR2 is input to one input terminal of the OR circuit OR1. A signal with the logical value of "0" is input to the other input terminal of the OR circuit OR1 from the NEOR circuit NEOR1. Thus the logical value of the output signal selectW output from the OR circuit OR1 is "0."

Because the logical value of the output signal selectW is "0," the PMOS transistors P2 and P3 are turned on. With the logical value of the control signal SR1 set to "0" and with the PMOS transistors P5 to P7 turned on, changing the logical value of the control signal CTRL from "1" to "0" and then from "0" to "1" causes a current to flow between the slave latch 32 and the MTJ elements MTJ1 and MTJ2. This causes the data held in the slave latch 32 to be written to the MTJ elements MTJ1 and MTJ2. In this case, the writing energy is consumed due to the current flowing to the MTJ elements MTJ1 and MTJ2.

Explained next is a Store 2 state in which, by contrast, the data held in the write control circuit 34 coincides with the data retained in the slave latch 32.

If the levels of the two input data items coincide with each other, the NEOR circuit NEOR1 outputs a signal with a logical value of "1." Thus a signal with a logical value of "0" obtained by inverting the control signal SR2 is input to one input terminal of the OR circuit OR1. A signal with a logical value of "1" is input to the other input terminal of the OR circuit OR1 from the NEOR circuit NEOR1. As a result, the logical value of the output signal selectW output from the OR circuit OR1 is "1."

Because the logical value of the output signal selectW is "1," the PMOS transistors P2 and P3 are turned off. Because the PMOS transistors P1 and P4 are also turned off, no current path is formed between the slave latch 32 and the MTJ element MTJ1 and MTJ2 even when the PMOS transistors P5 and P6 are turned on, so that no data is written to the MTJ elements MTJ1 and MTJ2. Because no current flows to the MTJ elements MTJ1 and MTJ2 at this point, the writing energy is not consumed.

The operations in the Store state are followed by a transition to a Sleep state. In the Sleep state, the logical value of the sleep control signal PS_EN is set to "1." The resulting inverted signal controls the power switch 114 to turn off its NMOS transistor N10, cutting off the supply of the GND voltage to the PG region. While the GND voltage is being cut off, all nodes in the circuits of the PG region are charged by leakage from the source voltage VDD. This causes the voltage of each node in the slave latch 32 to be same as the source voltage VDD.

Also in the Sleep state, the logical value of the control signal SR1 is "1." Thus the PMOS transistors P5 and P6 remain turned off.

With the Sleep state terminated, a restore operation is performed next to return to the normal operation. In a Restore state, the logical value of the sleep control signal PS_EN is changed from "1" to "0," the logical value of the control signal SR1 is changed from "1" to "0," and the logical value of the control signal SR2 is fixed at "0."

The NMOS transistor N10 in the power switch 14 is turned on. This resumes the supply of the GND voltage to the PG region, bringing down the ground potential from the VGND voltage to the GND voltage. Because the logical value of the control signal SR1 is set to "0," the PMOS transistors P5 to P7 are turned on. In addition, with the logical value of the control signal SR2 set to "0," the PMOS transistors P1 and P4 are turned on. This causes the data held in the MTJ elements MTJ1 and MTJ2 to be written to the slave latch 32. As a result, the data retained in the slave latch 32 before the GND voltage was cut off is restored.

Also in the Restore state, the logical value of the control signal SR1 is changed from "0" to "1" and the logical value of the control signal Save is changed from "0" to "1" at the time the restoration of data to the slave latch 32 is completed. Because the logical value of the control signal SR1 is set to "1," the PMOS transistors P5 to P7 are turned off. With the logical value of the control signal Save set to "1," the transfer gate TG5 is turned on and the transfer gate TG6 is turned off. As a result, the same data as that restored to the slave latch 32 is stored into the write control circuit 34.

As described above, the nonvolatile flip-flop circuit 116 of the embodiment provides the same functionality as that of the nonvolatile flip-flop circuit 16 of the embodiments above. Thus the nonvolatile flip-flop circuit 116 of the embodiment suppresses redundant write operations to the MTJ elements MTJ1 and MTJ2 and thereby reduces wasteful writing energy consumption.

Fourth Embodiment

A nonvolatile flip-flop circuit 116 of the embodiment differs from the nonvolatile flip-flop circuit 116 of the third embodiment in terms of the arrangement of the PMOS transistors P1 to P6 and of the logical circuits in the write control circuit 134. The other structures of the nonvolatile flip-flop circuit 116 and the overall configuration of the semiconductor integrated circuit 110 are the same as those of the embodiments above, and thus will not be discussed further.

Figure 10:
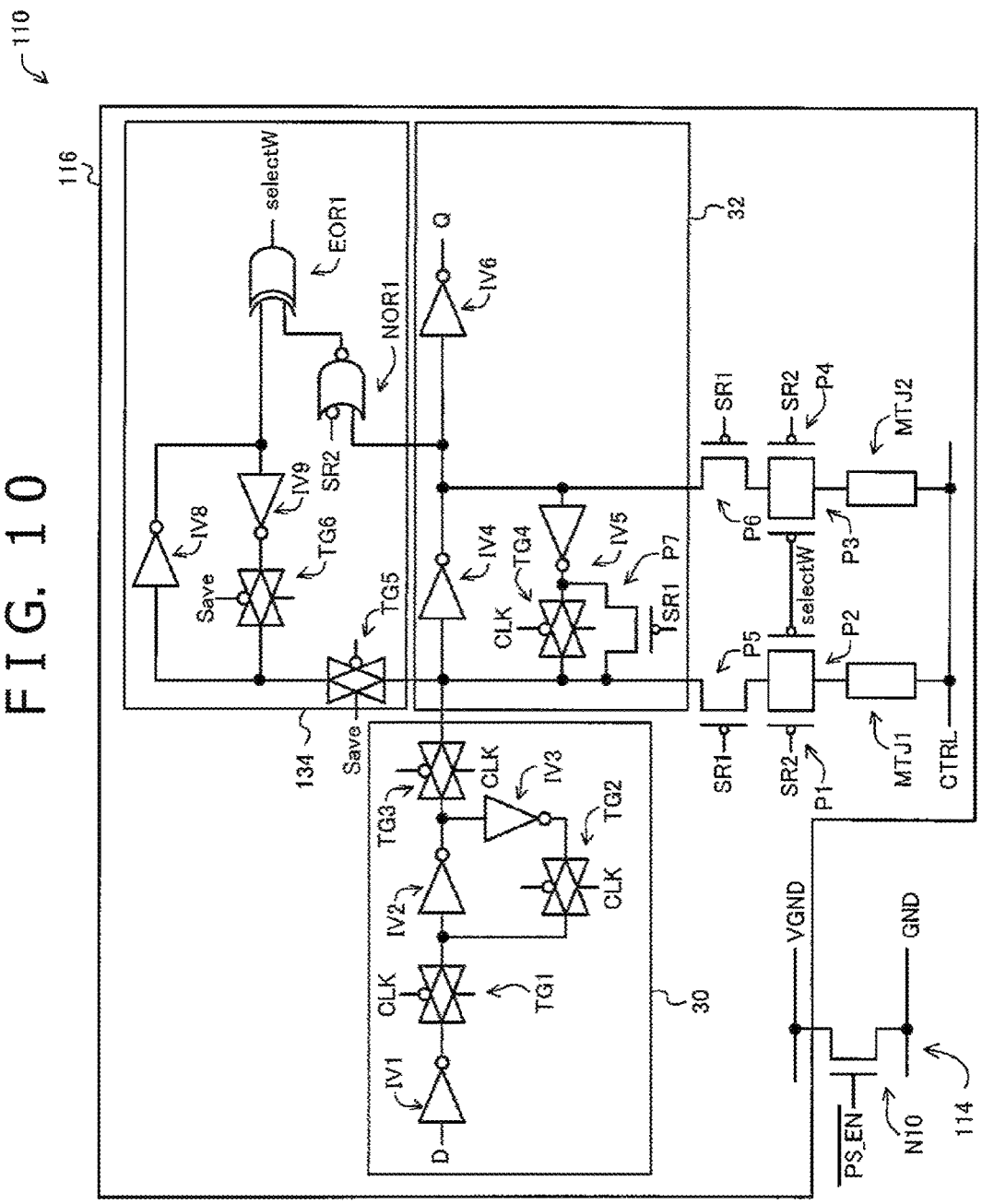
FIG. 10 is a circuit diagram of a nonvolatile flip-flop circuit of a fourth embodiment.

FIG. 10 is a circuit diagram of the nonvolatile flip-flop circuit of the embodiment. As depicted in FIG. 10, the PMOS transistors P5 and P6 are connected with the slave latch 32. The PMOS transistors P1 to P4 are connected with the MTJ elements MTJ1 and MTJ2.

Specifically, one end (source) of the PMOS transistor P5 is connected with the slave latch 32 (input of the inverter IV4). One end (source) of the PMOS transistor P6 is connected with the slave latch 32 (output of the inverter IV4). As in the third embodiment, the PMOS transistors P5 and P6 are controlled to be turned on and off in accordance with the control signal SR1.

One end (source) of the PMOS transistors P1 and P2 is connected with the other end (drain) of the PMOS transistor P5. The other end (drain) of the PMOS transistors P1 and P2 is connected with the MTJ element MTJ1. Meanwhile, one end of the PMOS transistors P3 and P4 is connected with the other end (drain) of the PMOS transistor P6. The other end (drain) of the PMOS transistors P3 and P4 is connected with the MTJ element MTJ2. As in the third embodiment, the PMOS transistors P1 and P4 are controlled to be turned on and off in accordance with the control signal SR2. The PMOS transistors P2 and P3 are controlled to be turned on and off in accordance with the output signal selectW output from the write control circuit 134.

The write control circuit 134 of the embodiment further includes a NOR circuit NOR1 and an Exclusive-OR (EOR) circuit EOR1 as logical circuits, as depicted in FIG. 10.

An inverted signal obtained by inverting the logical value of the control signal SR2 is input to one input terminal of the NOR circuit NOR1. The output of the inverter IV4 is input to the other input terminal of the NOR circuit NOR1. The output of the inverter IV8 is input to one input terminal of the EOR circuit EOR1. The output of the NOR circuit NOR1 is input to the other input terminal of the EOR circuit EOR1. The EOR circuit EOR1 outputs the output signal selectW.

The operation of the nonvolatile flip-flop circuit 116 of the embodiment is explained below.

In the Store state discussed above in connection with the third embodiment, the NOR circuit NOR1 outputs a signal obtained by inverting the logical value of the output signal from the inverter IV4 because the logical value of the control signal SR2 is "1" and the logical value of the inverted signal is "0." Thus if the data held in the write control circuit 134 coincides with the data retained in the slave latch 32, the two signals input to the EOR circuit EOR1 have different logical values. If the two data items do not coincide with each other, the two input signals to the EOR circuit EOR1 have the same logical value.

If the data held in the write control circuit 134 coincides with the data retained in the slave latch 32, the logical value of the output signal selectW output from the EOR circuit EOR1 is "1." If the two data items do not coincide with each other, the logical value of the output signal selectW is "0." Thus the write control circuit 134 outputs the output signal selectW in the same manner as in the Store state discussed above in connection with the third embodiment.

The nonvolatile flip-flop circuit 116 of the fourth embodiment is caused to operate in the same manner as in the control sequence explained above in connection with the third embodiment (see FIG. 9). Operating in this manner, the nonvolatile flip-flop circuit 116 of the fourth embodiment provides the same functionality as that of the nonvolatile flip-flop circuit 116 of the third embodiment.

As explained above, the nonvolatile flip-flop circuit 16 (116) of each of the above-described embodiments includes the master latch 30, slave latch 32, write control circuit 34 (134), MTJ elements MTJ1 and MTJ2, and NMOS transistors N1 to N6 (PMOS transistors P1 to P6).

The write control circuit 34 (134) temporarily stores the same data as the MTJ elements MTJ1 and MTJ2. When the source voltage is cut off (for store) upon power gating, the write control circuit 34 (134) compares its retained data with the data held in the slave latch 32 to control whether or not to write data to the MTJ elements MTJ1 and MTJ2. If the retained data does not coincide with the data held in the slave latch 32, the write control circuit 34 (134) performs control to write the data to the MTJ elements MTJ1 and MTJ2 using the output signal selectW. If the two data items coincide with each other, the write control circuit 34 (134) performs control not to write the data to the MTJ elements MTJ1 and MTJ2 using the output signal selectW.

In each of the above-described embodiments, the NMOS transistors N2 and N3 (PMOS transistors P2 and P3) are disposed on the current path between the slave latch 32 and the MTJ elements MTJ1 and MTJ2. The NMOS transistors N2 and N3 (PMOS transistors P2 and P3) are controlled to be turned on and off in accordance with the output signal selectW output from the write control circuit 34 (134).

If the retained data coincides with the data held in the slave latch 32, the write control circuit 34 (134) outputs the output signal selectW to turn off the NMOS transistors N2 and N3 (PMOS transistors P2 and P3). This prevents the current path from being formed between the slave latch 32 and the MTJ1 and MTJ2. As a result, the data held in the slave latch 32 is not written to the MTJ elements MTJ1 and MTJ2.

If the retained data does not coincide with the data held in the slave latch 32, the output signal selectW turns on the NMOS transistors N2 and N3 (PMOS transistors P2 and P3), forming the current path between the slave latch 32 and the MTJ elements MTJ1 and MTJ2. This allows the data held in the slave latch 32 to be written to the MTJ elements MTJ1 and MTJ2.

Figure 11:
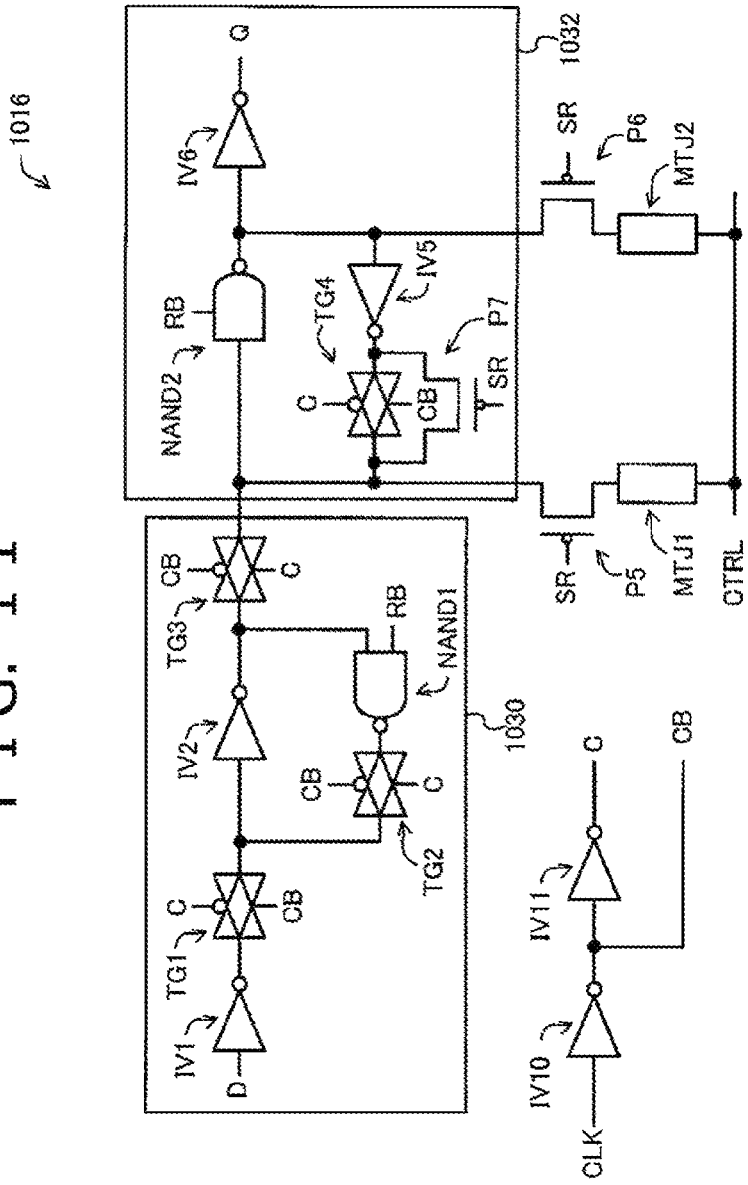
FIG. 11 is a circuit diagram of an existing nonvolatile flip-flop circuit.

Upon power gating, the existing nonvolatile flip-flop circuit (see the nonvolatile flip-flop circuit 1016 in FIG. 11) lets the write current flow regardless of the state of the MTJ elements MTJ1 and MTJ2. That is, in the existing nonvolatile flip-flop circuit, if the data retained in the MTJ elements MTJ1 and MTJ2 has the same logical value as that of the data about to be written, the current is nevertheless caused to flow to execute a write operation that turns out to be redundant. Since the existing nonvolatile flip-flop circuit is not provided with techniques for controlling the write operation depending on the data held in the MTJ elements MTJ1 and MTJ2, wasteful writing energy consumption has existed.

In the nonvolatile flip-flop circuit 16 (116) of each of the above-described embodiments, by contrast, if the data held in the MTJ elements MTJ1 and MTJ2 coincides with the data retained in the slave latch 32, no current path is formed between the slave latch 32 and the MTJ elements MTJ1 and MTJ2, with no current flowing therebetween.

The nonvolatile flip-flop circuit 16 (116) of each of the above-described embodiments thus reduces the energy to write data to the MTJ elements MTJ1 and MTJ2.

The write control circuit 34 (134) disposed in the nonvolatile flip-flop circuit 16 (116) of each of the above-described embodiments consumes energy. However, the energy consumed to write data to the MTJ elements MTJ1 and MTJ2 is larger by about one order of magnitude than the energy consumed by the write control circuit 34 (134). Thus with the write control circuit 34 (134) added to the nonvolatile flip-flop circuit 16 (116) of each of the above-described embodiments, it is still possible to significantly reduce energy consumption.

Although it was explained above in connection with each of the embodiments that one nonvolatile flip-flop circuit 16 (116) is disposed in the semiconductor integrated circuit 10

(110), the number of nonvolatile flip-flop circuits 16 (116) is not limited. Since each nonvolatile flip-flop circuit 16 (116) stores one-bit data, there may be provided as many nonvolatile flip-flop circuits 16 (116) as the number of bits of data to be stored.

If it is assumed that the semiconductor integrated circuit 10 (110) includes multiple nonvolatile flip-flop circuits 16 (116) and that each nonvolatile flip-flop circuit 16 (116) has a 50 percent probability to hold data with the logical value of "1" and a 50 percent probability to hold data with the logical value of "0," then half the entire nonvolatile flip-flop circuits 16 (116) supposedly need to have their data written anew to the MTJ elements MTJ1 and MTJ2. In this case, the energy to write data with the inventive nonvolatile flip-flop circuits 16 (116) is reduced to half the writing energy with the existing nonvolatile flip-flop circuits 16 (116).

It was explained above in connection with each of the embodiments that the write control circuit 34 (134) performs control to write the data held in the slave latch 32 to the MTJ elements MTJ1 and MTJ2. Alternatively, the write control circuit 34 (134) may be replaced with software to write data to the MTJ elements MTJ1 and MTJ2. In this case, a control section that includes a central processing unit (CPU) may be provided to acquire in advance the data held in the MTJ elements MTJ1 and MTJ2 for temporary storage or to acquire the data at the time of a store operation. The control section compares the data with the data retained in the slave latch 32. The control section outputs the output signal selectW with a logical value reflecting whether or not the two data items coincide with each other.

It was also explained above in connection with each of the embodiments that the MTJ elements MTJ1 and MTJ2 are used as an example of the nonvolatile storing section. However, this is not limitative of the present invention. Alternatively, any (nonvolatile) storing section may be utilized as long as it retains the stored data after the supply of the source voltage (ground voltage) is cut off by the power switch 14 (114).

The configurations and the operations of the semiconductor integrated circuit 10 (110), nonvolatile flip-flop circuit 16 (116), and other components of the above-described embodiments are only examples and may obviously be modified or varied as needed without departing from the sprit and scope of the present invention.

REFERENCE SIGNS LIST 10, 110 Semiconductor integrated circuit
14, 114 Power switch
16, 116 Nonvolatile flip-flop circuit
30 Master latch
32 Slave latch
34, 134 Write control circuit
MJ1, MJ2 MTJ element
N1 to N7, N10 NMOS transistor
P1 to P7, P10 PMOS transistor

What is claimed is:

1. A semiconductor device comprising:
a flip-flop;
a nonvolatile storing section configured to store data held in the flip-flop; and
a write control section configured to perform control to write the data held in the flip-flop to the nonvolatile storing section if, with supply of a source voltage or a ground voltage to the own device cut off, the data stored in the nonvolatile storing section does not coincide with the data held in the flip-flop, the write control section further performing control not to write the data held in the flip-flop to the nonvolatile storing section if the data stored in the nonvolatile storing section coincides with the data held in the flip-flop, wherein the write control section retains the data stored in the nonvolatile storing section, and performs the control based on a result of a comparison between the retained data and the data held in the flip-flop.

2. The semiconductor device according to claim 1, further comprising:
a first switch element configured to switch connection and disconnection between the flip-flop and the nonvolatile storing section,
wherein the write control section causes the first switch element to connect the flip-flop with the nonvolatile storing section when performing control to write the data, the write control section further causing the first switch element to disconnect the flip-flop from the nonvolatile storing section when performing control not to write the data.

3. The semiconductor device according to claim 1, further comprising:
a restoring section configured to restore the data written to the nonvolatile storing section in accordance with an externally input restoration control signal in order to restore the data written to the nonvolatile storing section upon resumption of the supply of the source voltage or the ground voltage previously cut off to the own device.

4. The semiconductor device according to claim 3, wherein the restoring section includes a second switch element configured to switch connection and disconnection between the flip-flop and the nonvolatile storing section in accordance with the restoration control signal.

5. The semiconductor device according to claim 1, wherein the nonvolatile storing section is a magnetic tunnel junction element.

* * * * *